United States Patent
Gould et al.

(10) Patent No.: US 10,847,501 B2
(45) Date of Patent: Nov. 24, 2020

(54) TUNABLE INTEGRATED OPTICS LED COMPONENTS AND METHODS

(71) Applicant: Cree, Inc., Durham, NC (US)

(72) Inventors: Troy Gould, Raleigh, NC (US); Colin Kelly Blakely, Franklinton, NC (US); Jesse Colin Reiherzer, Raleigh, NC (US); Joseph G. Clark, Raleigh, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 16/525,100

(22) Filed: Jul. 29, 2019

(65) Prior Publication Data

US 2019/0355701 A1    Nov. 21, 2019

Related U.S. Application Data

(62) Division of application No. 15/593,042, filed on May 11, 2017, now Pat. No. 10,410,997.

(51) Int. Cl.
*H01L 33/54* (2010.01)
*H01L 25/075* (2006.01)
(Continued)

(52) U.S. Cl.
CPC .......... *H01L 25/075* (2013.01); *H01L 33/502* (2013.01); *H01L 33/54* (2013.01); *H01L 33/58* (2013.01); *H01L 33/60* (2013.01); *H01L 33/62* (2013.01); *H01L 33/46* (2013.01); *H01L 2933/0058* (2013.01)

(58) Field of Classification Search
CPC ..... H01L 25/075; H01L 33/46; H01L 33/502; H01L 33/54; H01L 33/58; H01L 33/62
See application file for complete search history.

(56) References Cited

U.S. PATENT DOCUMENTS

| 4,918,497 A | 4/1990 | Edmond |
| 4,966,862 A | 10/1990 | Edmond |

(Continued)

FOREIGN PATENT DOCUMENTS

| DE | 100 32 839 A1 | 2/2002 |
| DE | 10 2005 011355 A1 | 9/2006 |
| WO | WO 2018/208528 A1 | 11/2018 |

OTHER PUBLICATIONS

Restriction Requirement for U.S. Appl. No. 15/593,042 dated Mar. 21, 2018.
(Continued)

*Primary Examiner* — Elias Ullah
(74) *Attorney, Agent, or Firm* — Jenkins, Wilson, Taylor & Hunt, P.A.

(57) ABSTRACT

Light emitting diode (LED) devices and methods. An example apparatus can include a substrate, one or more LEDs, light-transmissive encapsulation material, and a reflective material covering a portion of the encapsulation material to form a defined opening. The opening allows light emitted from an LED to pass through in a prescribed manner. In some embodiments, the apparatus can be subsequently treated to modify the surface having the opening. In other embodiments, the reflective material can be disposed on a lateral surface of the encapsulation material to reflect light in a desired direction.

7 Claims, 4 Drawing Sheets

(51) Int. Cl.
    *H01L 33/50*   (2010.01)
    *H01L 33/58*   (2010.01)
    *H01L 33/62*   (2010.01)
    *H01L 33/60*   (2010.01)
    *H01L 33/46*   (2010.01)

(56) References Cited

U.S. PATENT DOCUMENTS

| | | |
|---|---|---|
| 5,027,168 A | 6/1991 | Edmond |
| 5,177,593 A | 1/1993 | Abe |
| 5,210,051 A | 5/1993 | Carter, Jr. |
| 5,338,944 A | 8/1994 | Edmond et al. |
| 5,359,345 A | 10/1994 | Hunter |
| 5,393,993 A | 2/1995 | Edmond et al. |
| 5,416,342 A | 5/1995 | Edmond et al. |
| 5,523,589 A | 6/1996 | Edmond et al. |
| 5,604,135 A | 2/1997 | Edmond et al. |
| 5,631,190 A | 5/1997 | Negley |
| 5,739,554 A | 4/1998 | Edmond et al. |
| 5,912,477 A | 6/1999 | Negley |
| 6,120,600 A | 9/2000 | Edmond et al. |
| 6,187,606 B1 | 2/2001 | Edmond et al. |
| 6,201,262 B1 | 3/2001 | Edmond et al. |
| 6,600,175 B1 | 7/2003 | Baretz et al. |
| 6,791,119 B2 | 9/2004 | Slater et al. |
| 6,853,010 B2 | 2/2005 | Slater et al. |
| 6,958,497 B2 | 10/2005 | Emerson et al. |
| 7,095,056 B2 | 8/2006 | Vitta et al. |
| 7,213,940 B1 | 5/2007 | Van De Ven et al. |
| 7,456,499 B2 | 11/2008 | Loh et al. |
| 7,564,180 B2 | 7/2009 | Brandes |
| 7,655,957 B2 | 2/2010 | Loh et al. |
| 7,802,901 B2 | 9/2010 | McMillan |
| 7,821,023 B2 | 10/2010 | Yuan et al. |
| 7,952,544 B2 | 5/2011 | Roberts |
| 7,960,819 B2 | 6/2011 | Loh et al. |
| 7,999,283 B2 | 8/2011 | Chakraborty et al. |
| 8,018,135 B2 | 9/2011 | Van De Ven et al. |
| 8,044,418 B2 | 10/2011 | Loh et al. |
| 8,125,137 B2 | 2/2012 | Medendorp, Jr. et al. |
| 8,264,138 B2 | 9/2012 | Negley et al. |
| 8,337,071 B2 | 12/2012 | Negley et al. |
| 8,563,339 B2 | 10/2013 | Tarsa et al. |
| 8,729,589 B2 | 5/2014 | Hussell et al. |
| 8,866,410 B2 | 10/2014 | Negley et al. |
| 8,970,131 B2 | 3/2015 | Brandes et al. |
| 9,024,349 B2 | 5/2015 | Chitnis et al. |
| 9,131,561 B2 | 9/2015 | Athalye |
| 9,159,888 B2 | 10/2015 | Chitnis et al. |
| 9,277,605 B2 | 3/2016 | Ni |
| 9,414,454 B2 | 8/2016 | Brandes et al. |
| 9,713,211 B2 | 7/2017 | Van De Ven et al. |
| 9,793,247 B2 | 10/2017 | Yuan et al. |
| 10,410,997 B2 | 9/2019 | Gould et al. |
| 2006/0221272 A1 | 10/2006 | Negley et al. |
| 2007/0104828 A1 | 5/2007 | Fornaguera |
| 2008/0048200 A1 | 2/2008 | Mueller et al. |
| 2010/0091118 A1 | 4/2010 | Fujinawa |
| 2014/0328046 A1* | 11/2014 | Aanegola ............ F21V 13/08 362/84 |
| 2015/0257211 A1 | 9/2015 | Johnson et al. |
| 2016/0087168 A1 | 3/2016 | Huang et al. |
| 2017/0062681 A1 | 3/2017 | Miyoshi et al. |
| 2018/0331078 A1 | 11/2018 | Gould et al. |

OTHER PUBLICATIONS

Non-Final Office Action for U.S. Appl. No. 15/593,042 dated Jun. 15, 2018.
International Search Report and Written Opinion for Application No. PCT/US2018/030206 dated Jul. 23, 2018.
Final Office Action for U.S. Appl. No. 15/593,042 dated Jan. 14, 2019.
Advisory Action for U.S. Appl. No. 15/593,042 dated Mar. 15, 2019.
Notice of Allowance for U.S. Appl. No. 15/593,042 dated May 16, 2019.

* cited by examiner

TUNABLE INTEGRATED OPTICS LED COMPONENTS AND METHODS

CROSS REFERENCE TO RELATED APPLICATION

This application is a divisional of and claims priority to co-pending U.S. patent application Ser. No. 15/593,0442, filed May 11, 2017, the disclosure of which is hereby incorporated by reference in its entirety.

TECHNICAL FIELD

The subject matter disclosed herein relates generally to light emitting diodes (LEDs), components, and related methods. More particularly, the subject matter disclosed herein relates to solid state lighting apparatuses and related methods for controlling light output.

BACKGROUND

Light emitting diodes or "LEDs" are solid state devices that convert electrical energy into light.

Conventional LED arrays can sometimes have a transparent encapsulant covering the individual LEDs, such as for protection of the LEDs and to maximize the efficiency of the devices. When used in some applications, however, it may be desirable to reduce and/or focus the amount of reflected light. Directing and controlling the amount of light emitted can provide benefits such as, for example, increased contrast and image sharpness. One method to achieve this benefit is with the use of secondary optical devices, such as lenses. These devices can add cost and complexity to an LED apparatus, as well as contributing to efficiency losses. These drawbacks can be avoided by using component-level integrated optics to direct and control light output.

SUMMARY

Substrate based LEDs and related methods having improved reliability and performance are provided and described herein. Devices, components, and methods described herein can advantageously exhibit improved processing times, ease of manufacture, and/or lower processing costs. Devices, components, and related methods described herein are well suited for a variety of applications such as personal, industrial, and commercial lighting applications including, for example, light bulbs and light fixture products and/or applications. In some aspects, devices, components, and related methods described herein can comprise improved LED manufacturing processes and/or improved optical properties including improved light output, contrast, and more consistent and uniform light emission and color. Such devices can be less expensive and more efficient.

In some aspects, an LED apparatus can have a substrate, one or more LED disposed over the substrate, a light-transmissive encapsulation material disposed over the one or more LED, and a reflective material disposed on a portion of the encapsulation material such that the reflective material defines an opening to allow light to escape or pass from the encapsulation material and one or more LED.

In other aspects, a light emitting diode (LED) apparatus can have a substrate, one or more LED disposed over the substrate, a light-transmissive encapsulation material disposed over the one or more LED, and a reflective material disposed against one or more lateral surface of the encapsulation material and in contact with the substrate.

In other aspects, a method of producing an LED apparatus comprises providing a substrate with at least one LED disposed over the substrate, applying an encapsulation material over the at least one LED, and applying a reflective material on a portion of the encapsulation material such that the reflective material defines an opening to allow light to escape or pass from the encapsulation material and one or more LED.

In other aspects, a method of controlling light output from an LED apparatus comprises providing a substrate and one or more light emitting diode (LED) disposed over the substrate, applying an encapsulation material over the one or more LED, and controlling light output from the one or more LED by applying a layer of reflective material on a portion of the encapsulation material such that the reflective material creates an opening to allow light to escape or pass from the encapsulation material and one or more LED These and other objects of the present disclosure as can become apparent from the disclosure herein are achieved, at least in whole or in part, by the subject matter disclosed herein.

BRIEF DESCRIPTION OF DRAWINGS

A full and enabling disclosure of the present subject matter is set forth more particularly in the remainder of the specification, including reference to the accompanying figures, relating to one or more embodiments, in which.

DETAILED DESCRIPTION

Figure 1:
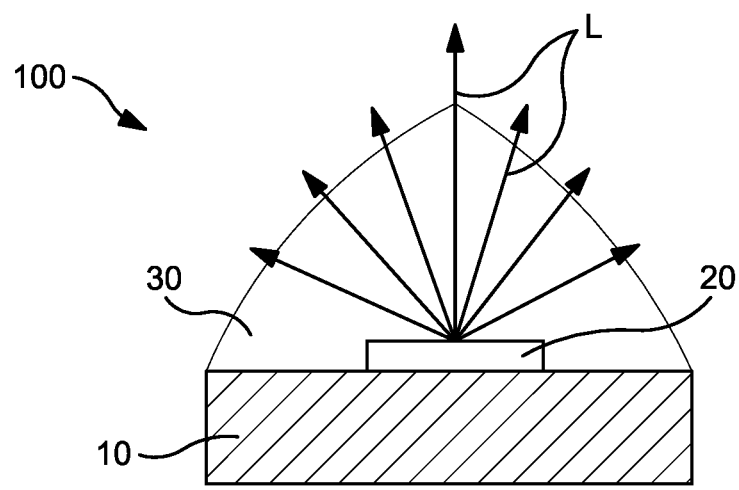
FIG. 1 is a cross-sectional side view of a prior art LED apparatus.

In some aspects, solid state lighting apparatuses, LED devices and/or systems, and methods for producing the same, described herein can comprise various solid state light emitter electrical configurations, color combinations, and/or circuitry components for providing solid state lighting apparatuses having improved efficiency, improved emission profiles, enhanced output and/or optimized color production. Apparatuses and methods such as those disclosed herein advantageously cost less, are more efficient, vivid, uniform, and/or brighter than some other solutions.

Unless otherwise defined, terms used herein should be construed to have the same meaning as commonly understood by one of ordinary skill in the art to which this subject matter belongs. It will be further understood that terms used herein should be interpreted as having a meaning that is consistent with the respective meaning in the context of this specification and the relevant art, and should not be interpreted in an idealized or overly formal sense unless expressly so defined herein.

Aspects of the subject matter are described herein with reference to sectional, perspective, elevation, and/or plan view illustrations that are schematic illustrations of idealized aspects of the subject matter. Variations from the shapes of the illustrations as a result, for example, of manufacturing techniques and/or tolerances, are to be expected, such that aspects of the subject matter should not be construed as limited to particular shapes illustrated herein. This subject matter can be embodied in different forms and should not be construed as limited to the specific aspects or embodiments set forth herein. In the drawings, the size and relative sizes of layers and regions can be exaggerated for clarity.

Unless the absence of one or more elements is specifically recited, the terms "comprising", "including", and "having" as used herein should be interpreted as open-ended terms that do not preclude the presence of one or more elements. Like numbers refer to like elements throughout this description.

It will be understood that when an element such as a layer, region, or substrate is referred to as being "on" another element, it can be directly on the other element or intervening elements can be present. Moreover, relative terms such as "on", "above", "upper", "top", "lower", or "bottom" are used herein to describe one structure's or portion's relationship to another structure or portion as illustrated in the figures. It will be understood that relative terms such as "on", "above", "upper", "top", "lower" or "bottom" are intended to encompass different orientations of the apparatus in addition to the orientation depicted in the figures. For example, if the apparatus in the figures is turned over, structure or portion described as "above" other structures or portions would now be oriented "below" the other structures or portions.

The terms "electrically activated emitter(s)" and "emitter(s)" as used herein are synonymous terms and refer to any device capable of producing visible or near visible (e.g., from infrared to ultraviolet) wavelength radiation, including for example but not limited to, xenon lamps, mercury lamps, sodium lamps, incandescent lamps, and solid state emitters, including LEDs or LED chips, organic light emitting diodes (OLEDs), and lasers.

The terms "solid state light emitter(s)", "solid state emitter(s)", and "light emitter(s)" are synonymous terms and refer to an LED chip, a laser diode, an organic LED chip, and/or any other semiconductor device preferably arranged as a semiconductor chip that comprises one or more semiconductor layers, which can comprise silicon, silicon carbide, gallium nitride and/or other semiconductor materials, a substrate which can comprise sapphire, silicon, silicon carbide and/or other microelectronic substrates, and one or more contact layers which can comprise metal and/or other conductive materials.

The terms "groups", "segments", "strings", and "sets" as used herein are synonymous terms. As used herein, these terms generally describe how multiple LEDs are electrically connected, such as in series, in parallel, in mixed series/parallel, in common anode, or in common anode configurations among mutually exclusive groups/segments/sets. The segments of LEDs can be configured in a number of different ways and may have circuits of varying functionality associated therewith (e.g. driver circuits, rectifying circuits, current limiting circuits, shunts, bypass circuits, etc.), as discussed, for example, in commonly assigned and co-pending U.S. patent application Ser. No. 12/566,195, filed on Sep. 24, 2009, U.S. patent application Ser. No. 13/769,273, filed on Feb. 15, 2013, U.S. patent application Ser. No. 13/769,277 filed on Feb. 15, 2013, U.S. patent application Ser. No. 13/235,103, filed on Sep. 16, 2011, U.S. patent application Ser. No. 13/235,127, filed on Sep. 16, 2011, and U.S. Pat. No. 8,729,589, which issued on May 20, 2014, the disclosure of each of which is hereby incorporated by reference herein in the entirety.

The term "targeted" refers to configurations of LED chip segments that are configured to provide a pre-defined lighting characteristic that is a specified parameter for the lighting apparatus. For example, the targeted spectral power distribution can describe the characteristic of the light that is generated at a particular power, current, or voltage level.

Apparatuses, systems, and methods as disclosed herein can utilize red chips, green chips, and blue chips. In some aspects, chips for use in blue-shifted yellow light (BSY) devices can target different bins as set forth in Table 1 of commonly owned, assigned, and co-pending U.S. patent application Ser. No. 12/257,804, published as U.S. Pat. Pub. No. 2009/0160363, the disclosure of which is incorporated by reference herein in the entirety. Apparatuses, systems, and methods herein can utilize, for example, ultraviolet (UV) chips, cyan chips, blue chips, green chips, red chips, amber chips, and/or infrared chips.

The term "substrate" as used herein in connection with lighting apparatuses refers to a mounting member or element on which, in which, or over which, multiple solid state light emitters (e.g., LEDs) can be arranged, supported, and/or mounted. A substrate can be, e.g., a component substrate, a chip substrate (e.g., an LED substrate), or a sub-panel substrate. Exemplary substrates useful with lighting apparatuses as described herein can for example comprise printed circuit boards (PCBs) and/or related components (e.g., including but not limited to metal core printed circuit boards (MCPCBs), flexible circuit boards, dielectric laminates, ceramic based substrates, and the like), ceramic or metal boards having FR4 and/or electrical traces arranged on one or multiple surfaces thereof, high reflectivity ceramics (e.g., alumina) support panels, and/or mounting elements of various materials and conformations arranged to receive, support, and/or conduct electrical power to solid state emitters. Electrical traces described herein provide electrical power to the emitters for electrically activating and illuminating the emitters. Electrical traces may be visible and/or covered via a reflective covering, such as a solder mask material, Ag, or other suitable reflector.

In some embodiments, one substrate can be used to support multiple groups of solid state light emitters in addition to at least some other circuits and/or circuit elements, such as a power or current driving components and/or current switching components. In other aspects, two or more substrates (e.g., at least a primary substrate and one or more secondary substrate or substrates) can be used to support multiple groups of solid state light emitters in addition to at least some other circuits and/or circuit elements, such as a power or current driving components and/or temperature compensation components. The first and second (e.g., primary and secondary) substrates can be disposed above and/or below each other and along different planes, adjacent (e.g., side-by-side) to each other, have one or more co-planar surfaces disposed adjacent each other, arranged vertically, arranged horizontally, and/or arranged in any other orientation with respect to each other.

LEDs useable with lighting apparatuses as disclosed herein can comprise horizontal structures (with both electrical contacts on a same side of the LED chip) and/or vertical structures (with electrical contacts on opposite sides of the LED chip). A horizontally structured chip (with or without the growth substrate), for example, can be flip chip bonded (e.g., using solder) to a carrier substrate or printed circuit board (PCB), or wire bonded. A vertically structured chip (without or without the growth substrate) can have a first terminal solder bonded to a carrier substrate, mounting pad, or printed circuit board (PCB), and have a second terminal wire bonded to the carrier substrate, electrical element, or PCB.

Electrically activated light emitters, such as solid state emitters, can be used individually or in groups to emit light to stimulate emissions of one or more lumiphoric materials (e.g., phosphors, scintillators, lumiphoric inks, quantum dots), and generate light at one or more peak wavelengths, or of at least one desired perceived color (including combinations of colors that can be perceived as white). Inclusion of lumiphoric (also called 'luminescent') materials in lighting apparatuses as described herein can be accomplished by an application of a direct coating of the material on lumiphor support elements or lumiphor support surfaces (e.g., by powder coating, inkjet printing, or the like), adding such materials to lenses, and/or by embedding or dispersing such materials within lumiphor support elements or surfaces. Methods for fabricating LEDs having a planarized coating of phosphor integrated therewith are discussed by way of example in U.S. Patent Application Publication No. 2008/0179611, filed on Sep. 7, 2007, to Chitnis et al., the disclosure of which is hereby incorporated by reference herein in the entirety.

Other materials, such as light scattering elements (e.g., particles) and/or index matching materials can be associated with a lumiphoric material-containing element or surface. Apparatuses and methods as disclosed herein can comprise LEDs of different colors, one or more of which can be white emitting (e.g., including at least one LED with one or more lumiphoric materials).

In some aspects, one or more short wavelength solid state emitters (e.g., blue and/or cyan LEDs) can be used to stimulate emissions from a mixture of lumiphoric materials, or discrete layers of lumiphoric material, including red, yellow, and green lumiphoric materials. LEDs of different wavelengths can be present in the same group of solid state emitters, or can be provided in different groups of solid state emitters. A wide variety of wavelength conversion materials (e.g., luminescent materials, also known as lumiphors or lumiphoric media, e.g., as disclosed in U.S. Pat. No. 6,600,175, issued on Jul. 29, 2003, and U.S. Patent Application Publication No. 2009/0184616, filed on Oct. 9, 2008, each disclosure of which is hereby incorporated by reference herein in the entirety), are well-known and available to persons of skill in the art.

In some aspects, lighting apparatuses and systems as described herein comprise multiple sets of solid state light emitters targeting different colors (e.g., one set targeting a first color and at least a second set targeting a second color that is different than the first color). In some aspects, each set of the multiple sets comprises at least two solid state light emitters of a same color (e.g., the peak wavelengths coincide). In some aspects, each set of the multiple sets of solid state emitters is adapted to emit one or more different color(s) of light. In some aspects, each set of the multiple sets of solid state emitters is adapted to emit one or more color(s) of light that differ relative to one another (e.g., with each set of solid state emitters emitting at least one peak wavelength that is not emitted by another set of solid state emitters). Aspects of targeting and selectively activating sets of solid state emitters according to the present subject matter may be provided using the circuitry and/or techniques described in commonly assigned and co-pending U.S. patent application Ser. No. 14/221,839, the disclosure of which was previously incorporated hereinabove by reference.

The term "color" in reference to a solid state emitter refers to the color and/or wavelength of light that is emitted by the chip upon passage of electrical current therethrough.

Some embodiments of the present subject matter may use solid state emitters, emitter packages, fixtures, luminescent materials/elements, power supply elements, control elements, and/or methods such as described in U.S. Pat. Nos. 7,564,180; 7,456,499; 7,213,940; 7,095,056; 6,958,497; 6,853,010; 6,791,119; 6,600,175, 6,201,262; 6,187,606; 6,120,600; 5,912,477; 5,739,554; 5,631,190; 5,604,135; 5,523,589; 5,416,342; 5,393,993; 5,359,345; 5,338,944; 5,210,051; 5,027,168; 5,027,168; 4,966,862, and/or 4,918,497, and U.S. Patent Application Publication Nos. 2009/0184616; 2009/0080185; 2009/0050908; 2009/0050907; 2008/0308825; 2008/0198112; 2008/0179611, 2008/0173884, 2008/0121921; 2008/0012036; 2007/0253209; 2007/0223219; 2007/0170447; 2007/0158668; 2007/0139923, and/or 2006/0221272; U.S. patent application Ser. No. 11/556,440, filed on Dec. 4, 2006; with the disclosures of the foregoing patents, published patent applications, and patent application serial numbers being hereby incorporated by reference as if set forth fully herein.

The terms "lighting apparatus" and "module" as used herein are synonymous, and are not limited, except that it is capable of emitting light. That is, a lighting apparatus can be a device or apparatus that illuminates an area or volume, e.g., a structure, a swimming pool or spa, a room, a warehouse, an indicator, a road, a parking lot, a vehicle, signage (e.g., road signs, a billboard), a ship, a toy, a mirror, a vessel, an electronic device, a boat, an aircraft, a stadium, a computer, a remote audio device, a remote video device, a cell phone, a tree, a window, an LCD display, a cave, a tunnel, a yard, a lamppost, or a device or array of devices that illuminate an enclosure, or a device that is used for edge or back-lighting (e.g., backlight poster, signage, LCD displays), light bulbs, bulb replacements (e.g., for replacing AC incandescent lights, low voltage lights, fluorescent lights, etc.), outdoor lighting, security lighting, exterior residential lighting (wall mounts, post/column mounts), ceiling fixtures/wall sconces, under cabinet lighting, lamps (floor and/or table and/or desk), landscape lighting, track lighting, task lighting, specialty lighting, rope lights, ceiling fan lighting, archival/art display lighting, high vibration/impact lighting-work lights, etc., mirrors/vanity lighting, spotlighting, high-bay lighting, low-bay lighting, or any other light emitting device.

Phosphor and phosphor compounds as disclosed herein can in some aspects comprise one or more of a wide variety of wavelength conversion materials or color conversion components including luminescent materials. Examples of luminescent materials (lumiphors) include phosphors, Cerium-doped Yttrium Aluminum Garnet (YAG) (e.g. LuAG:Ce), Nitrides, Oxy-Nitrides, scintillators, day glow tapes, nanophosphors, quantum dots (e.g., such as provided by NNCrystal US Corp., Fayetteville, Ark.), and inks that glow in the visible spectrum upon illumination with (e.g., ultraviolet) light. Inclusion of lumiphors in wavelength conversion components or related components as disclosed herein, in conjunction with solid state light emitters and LEDs, can be accomplished by providing layers (e.g., coatings) of such materials over solid state emitters and/or by dispersing luminescent materials to a clear encapsulant (e.g., epoxy-based or silicone-based curable resin or other polymeric matrix) arranged to cover or partially cover one or more solid state light emitters. One or more luminescent materials useable in devices as described herein may be down-converting or up-converting, or can include a combination of both types.

Wavelength conversion materials can provide benefits including, for example, improved long term reliability (e.g., improved properties at around 1000 hours or more and 85° C., 105° C., and/or 125° C.), decreased bubbling around solid state light emitters, a larger viewing angle, lower dCCT color spread, cooler phosphor temperatures, brighter light emission, improved sulfur resistance, and/or a smaller color point spread, including all or any combination of such features.

The presently disclosed subject matter is directed to embodiments of LED structures having a light source that comprises LEDs. The LED packages can be arranged in different ways and are relatively small, while at the same time are efficient, reliable and cost effective. The embodiments according to the disclosure herein can have different shaped encapsulants, and can emit light with improved or similar efficiency compared to similar LED packages with fully hemispheric encapsulants. In some embodiments where a plurality of LEDs are mounted on a substrate, the spacing between each LED chip can be controlled to optimize the intensity of light output from the LED package. The LED packages according to the disclosure herein can also be smaller and less expensive to manufacture.

The disclosure herein is described with reference to example embodiments, but it is understood that the disclosure herein can be embodied in many different forms and should not be construed as limited to the embodiments set forth herein. In particular, the disclosure herein is described below in regards to certain LED apparatuses having LEDs in different configurations, but it is understood that the disclosure herein can be used for many other LED packages with other LED configurations. LED packages using the disclosure herein can also have many different shapes beyond those described below, such as rectangular, and the solder pads and attach pads can be arranged in many different ways. In other embodiments, the emission intensity of the different types of LEDs can be controlled to vary the overall LED package emission.

The embodiments described herein are with reference to an LED or LEDs, but in accordance with the disclosure herein and in some aspects LEDs as used herein can include LED chips or any other suitable structure or structures. For example, LEDs as used herein can be individual junctions of a monolithic LED. For example, instead of being completely separate LED chips, the LEDs can each be a LED region all on a common substrate that can have different types of monolithic junctions. A mesa between the LEDs and on the common substrate can extend to certain layers or can extend all the way to or from the common substrate. Therefore, a monolithic LED can comprise more than one LED junctions on a common substrate, and the gaps between the LEDs can be formed by the mesas that can at least partially separate the LEDs.

The components described herein can have different shapes and sizes beyond those shown, and one or different numbers of LEDs can be included. It is also understood that the embodiments described below utilize co-planar light sources, but it is understood that non co-planar light sources can also be used. It is also understood that an LED light source may be comprised of multiple LEDs that may have different emission wavelengths. As mentioned above, in some embodiments at least some of the LEDs can comprise blue emitting LEDs covered with a yellow phosphor along with red emitting LEDs, resulting in a white light emission from the LED package. In multiple LED packages, the LEDs can be serially interconnected or can be interconnected in different serial and parallel combinations.

Coatings, encapsulants, encapsulant layers, and the like are disclosed herein and can comprise any material that provides mechanical, chemical, and/or environmental protection to a substrate, reflective layer, or other LED component. A coating, encapsulant and/or encapsulant layer can be configured in some embodiments as a layer that covers a substantially horizontal or vertical surface, and in some aspects can comprise a layer disposed on top of another layer, surface or structure whether or not it fully surrounds all sides of the other layer, surface or structure. In some embodiments a coating, encapsulant and/or encapsulant layer can comprise or consist of a dielectric as disclosed herein. It is also understood that when an feature or element such as a layer, region, encapsulant or submount may be referred to as being "on" another element, it can be directly on the other element or intervening elements may also be present. Furthermore, relative terms such as "inner", "outer", "upper", "above", "lower", "beneath", and "below", and similar terms, may be used herein to describe a relationship of one layer or another region. It is understood that these terms are intended to encompass different orientations of the device in addition to the orientation depicted in the figures.

Embodiments of the present disclosure are described herein with reference to cross-sectional view illustrations that are schematic illustrations of embodiments of the disclosure. As such, the actual thickness of the layers can be different, and variations from the shapes of the illustrations as a result, for example, of manufacturing techniques and/or tolerances are expected. Embodiments of the disclosure should not be construed as limited to the particular shapes of the regions illustrated herein but are to include deviations in shapes that result, for example, from manufacturing. A region illustrated or described as square or rectangular will typically have rounded or curved features due to normal manufacturing tolerances. Thus, the regions illustrated in the figures are schematic in nature and their shapes are not intended to illustrate the precise shape of a region of a device and are not intended to limit the scope of the disclosure herein.

Coating materials disclosed herein can in some aspects comprise a number of encapsulating layers, coatings and/or dielectric materials and compounds, including for example silicon oxide, silicon nitride, aluminum oxide, titanium dioxide, non-metallic oxides, non-metallic nitrides, tantalum oxide, aluminum, nickel, titanium, tungsten, platinum, combinations thereof or alloys thereof, etc. In some aspects such encapsulants, coatings and/or dielectrics can comprise one or more materials arranged to provide desired electrical isolation and high thermal conductivity. For example, a dielectric can provide a desired electrical isolation between electrical traces and/or sets of solid state emitters. In some aspects, such substrates can comprise ceramic such as alumina ($Al_2O_3$), aluminum nitride (AlN), silicon carbide (SiC), silicon, or a plastic or polymeric material such as polyimide, polyester, metal, etc.

Disclosed herein are LED apparatuses or devices that are particularly useful for providing bright light from LEDs mounted on a substrate. By providing a first light-transmissive material or layer encapsulating the LED and a subsequent application of a reflective material or layer, the direction and sharpness of emitted light can be more easily controlled. In one aspect, an LED apparatus can comprise an encapsulation material over a substrate and one or more LED, which are covered in an optical layer. A reflective material can be disposed over the encapsulation material so that the reflective material defines and provides or defines an opening or window such that the reflective material defines the opening where the encapsulation material is not covered by the reflective material which allows light to pass through the opening from the one or more LED. This allows light to escape or pass from the LED apparatus in a predetermined, controlled and directed manner. The encapsulation material and the reflective material can be disposed such that the materials extend to the edge of the substrate. In some aspects, a surface formed by the substrate, the encapsulation material, and the reflective material can be a continuous surface, such as for example, a planar surface. An LED apparatus as disclosed herein can further comprise a plurality of LEDs configured to emit light that is a same color or are different colors.

In another aspect, an LED apparatus can comprise an encapsulation material as disclosed hereinabove, but in this case the reflective material can be disposed on one or more lateral surface of the encapsulation material at an angle to the surface of the substrate. This creates a reflective "wall" for directing the light obliquely from the apparatus.

In a further aspect, a method of producing a panel of such LEDs is described. The method includes applying an encapsulation material or layer over a substrate and one or more LED and then applying an opaque reflective material or layer over the encapsulation material. The method can optionally include removing a portion of the opaque reflective material or layer to expose a further portion of the clear encapsulation material. The layers can be removed by any suitable technique, such as for example by grinding, sanding, buffing, or lapping. The resulting surface can then further be optionally treated to achieve a desired finish, in a range from matte to high gloss.

According to existing art, an LED apparatus generally designated 100 can be provided with a substrate 10, one or more LED 20, and the device can be encapsulated with a clear or light-transmissive encapsulation material 30, as shown in FIG. 1. The encapsulation material can be, for example, compounds such as described above. Encapsulation material 30 can be applied in any suitable manner and in a variety of ways, such as for example, by molding, dispensing, spraying, or any other suitable method. In this manner LED 20 is protected from corrosion and light L is dispersed in a wide viewing angle above substrate 10. However, there may be applications where it is desired to have a prescribed viewing angle rather than a fully open viewing angle. The devices and methods disclosed herein provide a solution to this need.

Figure 2:
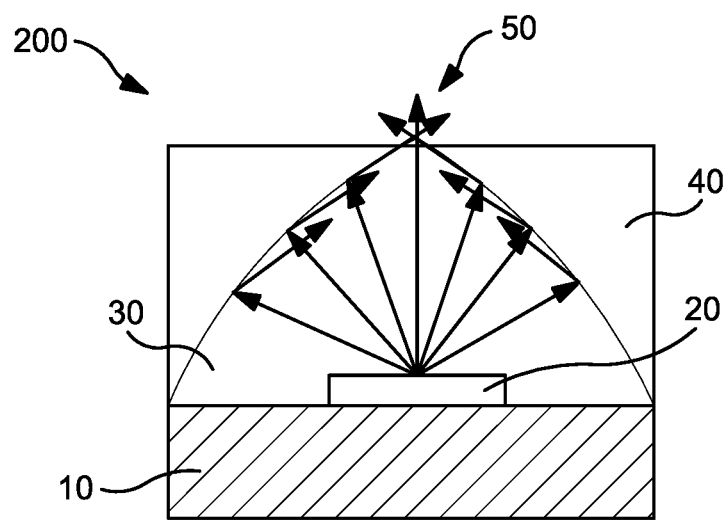
FIG. 2 is a cross-sectional side view of an embodiment of an LED apparatus.

In one embodiment of an LED depicted for example in FIG. 2, an LED apparatus generally designated 200 has a substrate 10, one or more LED 20 disposed over substrate 10, and an encapsulation material 30 disposed over at least a portion of substrate 10 and LED 20. Encapsulation material 30 can be a light-transmissive layer. LED apparatus 200 further comprises a reflective material or layer 40 that can be disposed against and can cover a portion of encapsulation material 30, while providing an opening, window, or area generally designated 50. Light can be emitted from LED 20, through encapsulation material 30 and pass for example upwardly in multiple different directions as represented for example by the arrows in FIG. 2. The light will be reflected by reflective material or layer 40, which creates or defines the window or aperture where reflective material or layer 40 does not cover encapsulation materials or layer 30. Reflective material or layer 40 therefore allows passage of light through area 50, concentrating the light output through a defined viewing angle and effectively creating an integrated component-level optic. Reflective material or layer 40 can be a light-colored layer such as titania and/or other reflective material(s), or reflective material or layer 40 can also be a black material or layer which acts as a reflective surface when disposed on light-transmissive encapsulation material 30. In this example embodiment LED apparatus 200 has continuous planar surfaces at the boundaries of substrate 10.

Figure 3A:
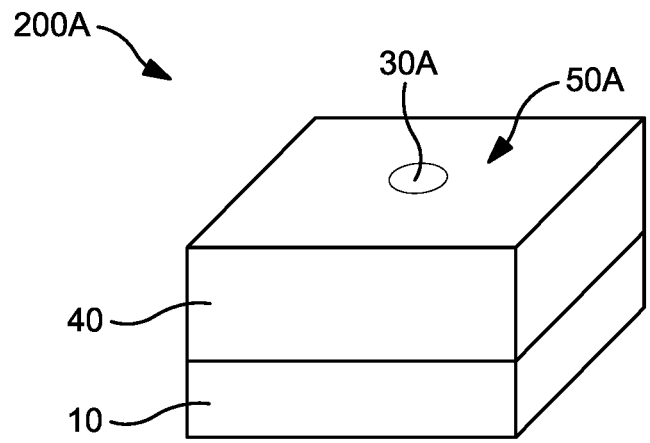
FIGS. 3A and 3B are isometric views of a further embodiment of an LED apparatus.
Figure 3B:
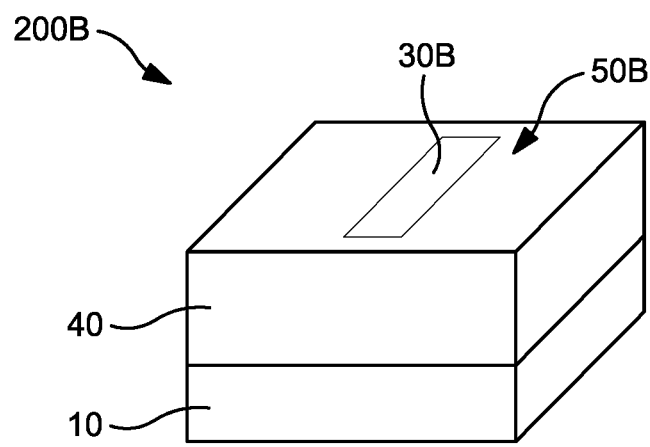

FIGS. 3A and 3B depict examples of possible geometries for areas on LED apparatuses 200A and 200B, respectively. For example, FIG. 3A shows LED apparatus 200A with area generally designated 50A having a round configuration or window through which encapsulation material 30A is visible. In another example shown in FIG. 3B, LED apparatus 200B has area generally designated 50B having a rectangular configuration or window through which encapsulation material 30B is visible. It is to be understood that these examples are non-limiting and that any suitable configuration or variety of configurations can be used. For example, the encapsulation material or layer can be dome, spherical, bullet, pyramidal, or otherwise shaped, and the reflective material or layer can be suitably shaped as desired against the encapsulation material or layer.

Figure 4A:
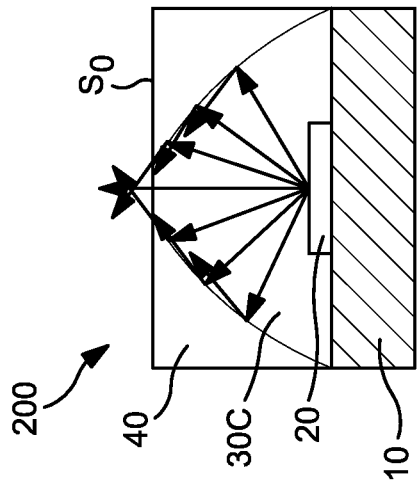
FIG. 4A is a cross-sectional view of a further embodiment of an LED apparatus.
Figure 5A:
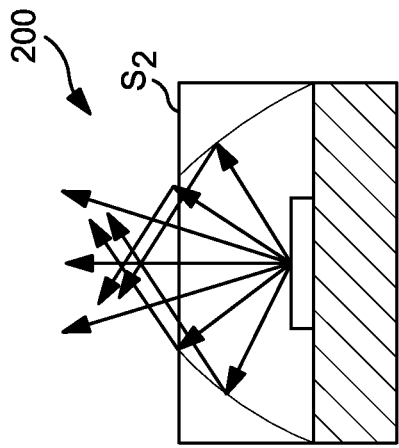
FIG. 5A is a cross-sectional view of a further embodiment of an LED apparatus.
Figure 4B:
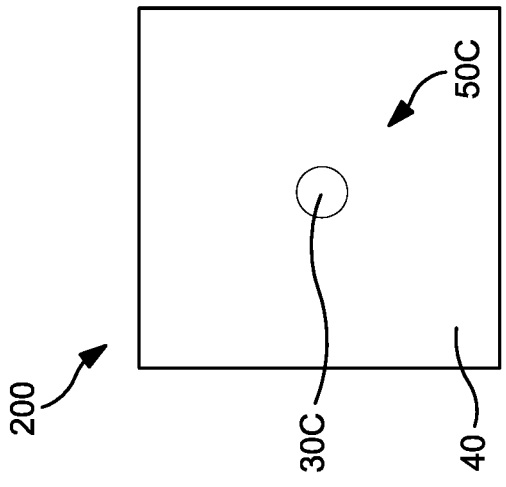
FIG. 4B is a top view of the LED apparatus shown in FIG. 4A.
Figure 5B:
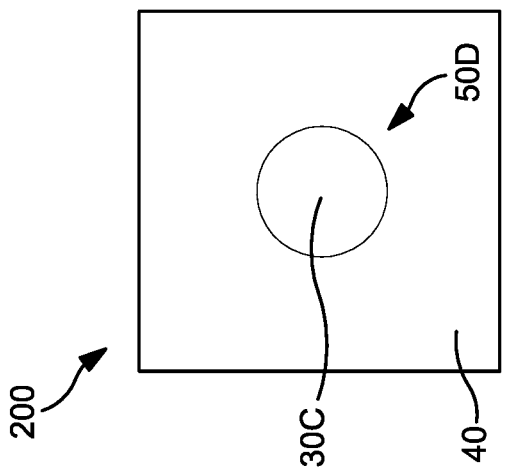
FIG. 5B is a top view of the LED apparatus shown in FIG. 5A.

Referring to FIGS. 4A-4B and in other embodiments, the thickness of reflective material or layer 40 can be adjusted to affect the amount of light emitted from LED apparatus 200. For example, reflective material or layer 40 can be disposed on encapsulation material 30C. Reflective material or layer 40 can initially have a surface $S_0$ above substrate 10 as depicted in FIGS. 4A-4B, FIG. 4B being a top view of FIG. 4A. The resulting window can be an opening or area generally designated 50C. Opening 50C can in some embodiments be smaller than a width of LED 20, creating a prescribed viewing angle. Surface $S_0$ of reflective material or layer 40 can be then polished or removed in any suitable fashion in order to fine-tune the viewing angle of LED 20. FIGS. 5A-5B show an embodiment of LED apparatus 200 from side and top views, respectively, after surface $S_0$ has been removed. In FIGS. 5A-5B, surface $S_1$ is at a reduced height from surface $S_0$. This decreases the overall height of LED apparatus 200 and creates a larger window in reflective material or layer 40, resulting in a larger opening or area generally designated 50D for light to escape or pass. In this embodiment, opening 50D can be substantially the same width as a width of LED 20.

Figure 6A:
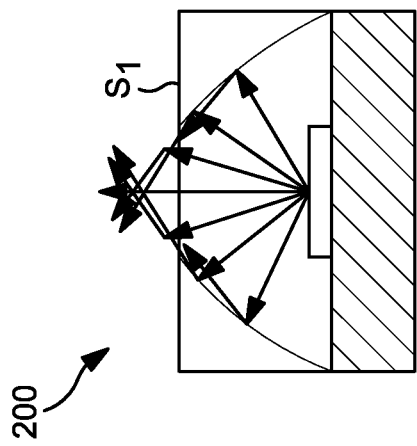
FIG. 6A is a cross-sectional view of a further embodiment of an LED apparatus.
Figure 6B:
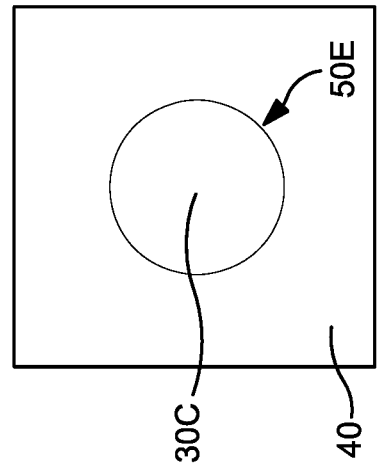
FIG. 6B is a top view of the LED apparatus shown in FIG. 6A.

Similarly, FIGS. 6A-6B show an embodiment of LED apparatus 200 from side and top views, respectively. In this embodiment surface $S_0$ has been removed to a greater extent, resulting in surface $S_2$. The resulting opening or area generally designated 50E can be larger than a width of LED 20.

Figure 7:
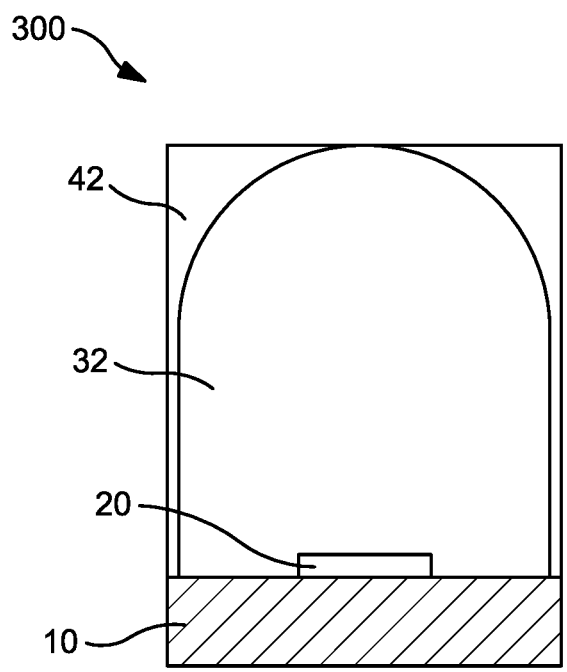
FIGS. 7-9 are cross-sectional side views of various embodiments of an LED apparatus.

In another example embodiment shown in FIG. 7, an LED apparatus generally designated 300 has a substrate 10, one or more LED 20 disposed over substrate 10, and a light-transmissive encapsulation material 32 disposed over at least a portion of substrate 10 and LED 20. Encapsulation material 32 can have a dome shape with vertical walls, and reflective material or layer 42 can be disposed on encapsulation material 32 except for the apex of the dome, forming a small opening where encapsulation material 32 is not covered by reflective material 42. In this way light from LED 20 can be emitted in a narrow viewing angle. As with previous embodiments, the top surface of LED apparatus 300 comprising the opening can be polished or removed in any suitable fashion in order to modify the viewing angle for light from LED 20.

Figure 8:
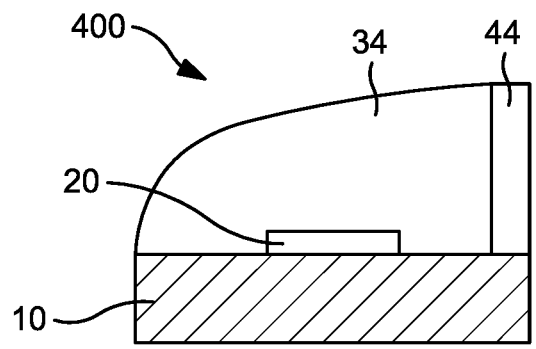
Figure 9:
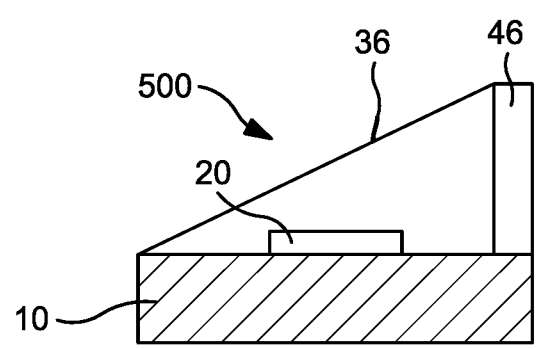

In an alternate embodiment, an LED apparatus can have a substrate, one or more LED, an encapsulant, and a reflective material disposed on one or more lateral surface of the encapsulation material and also in contact with a surface of the substrate. Examples of this embodiment are depicted in FIGS. 8 and 9. For example, in FIG. 8 an LED apparatus generally designated 400 has a substrate 10, one or more LED 20 disposed over substrate 10, and a light-transmissive encapsulation material 34, which forms a generally dome shape with at least one planar portion perpendicular or at an angle to the upper surface of substrate 10. Reflective material or layer 44 is disposed on a planar portion or side of encapsulation material 34. In this way light can be reflected in a direction away from the planar portion or portions.

FIG. 9 depicts a similar embodiment of LED apparatus generally designated 500. LED apparatus 500 has a substrate 10, one or more LED 20 disposed over substrate 10, a light-transmissive encapsulation material 36, and a reflective material or layer 46. Encapsulation material 36 in this case has a substantially flat outer surface at an angle from substrate 10, and a planar portion perpendicular or at an angle to substrate 10. Encapsulation material 46 is disposed perpendicular to substrate 10 on the planar portion of encapsulation material 36. It is to be understood that these examples are non-limiting and that any suitable configuration or variety of configurations can be used. For example, the surface of the encapsulation material can be disposed at an acute angle to the surface of the substrate, and the reflective material can be disposed on more than one lateral side of the encapsulation material. The lateral sides of the encapsulation material can further be curved rather than planar.

While the subject matter has been has been described herein in reference to specific aspects, features, and illustrative embodiments, it will be appreciated that the utility of the subject matter is not thus limited, but rather extends to and encompasses numerous other variations, modifications and alternative embodiments, as will suggest themselves to those of ordinary skill in the field of the present subject matter, based on the disclosure herein.

Aspects disclosed herein can, for example and without limitation, provide one or more of the following beneficial technical effects: reduced cost of providing solid state lighting apparatuses; improved or more robust optical control; reduced size, volume, or footprint of solid state lighting apparatuses; improved efficiency; improved color rendering; improved thermal management; simplified circuitry; improved contrast, improved viewing angle; improved color mixing; improved reliability; and/or simplified DC or AC operability.

Various combinations and sub-combinations of the structures and features described herein are contemplated and will be apparent to a skilled person having knowledge of this disclosure. Any of the various features and elements as disclosed herein can be combined with one or more other disclosed features and elements unless indicated to the contrary herein. Correspondingly, the subject matter as hereinafter claimed is intended to be broadly construed and interpreted, as including all such variations, modifications and alternative embodiments, within its scope and including equivalents of the claims.

The invention claimed is:

1. A method of producing a light emitting diode (LED) apparatus, the method comprising:
   providing a substrate with at least one LED disposed over the substrate;
   applying an encapsulation material over the at least one LED; and
   applying, after the encapsulation material is applied over the at least one LED, a reflective material on a portion of the encapsulation material such that the reflective material defines an opening where the encapsulation material is not covered by the reflective material to allow light to pass through the opening from the one or more LED.

2. The method of claim 1, comprising removing the reflective material in a region above the at least one LED to expose a further portion of the encapsulation material.

3. The method of claim 2, comprising lapping or buffing the exposed encapsulation material to result in a surface finish from matte to high gloss.

4. A method of controlling light output from a light emitting diode (LED) apparatus, the method comprising:
   providing an LED apparatus comprising:
      a substrate;
      one or more LED disposed over the substrate; and
      an encapsulation material disposed over the one or more LED; and
   controlling light output from the one or more LED by applying, after the encapsulation material has been disposed over the one or more LED, a layer of light-transmissive reflective material on a portion of the encapsulation material such that the reflective material creates an opening where the encapsulation material is not covered by the reflective material to allow light to pass through the opening from the one or more LED.

5. The method of claim 4, comprising removing a portion of the reflective material from the encapsulation material to increase a size of the opening.

6. The method of claim 1, wherein a width of the encapsulation material where the encapsulation material contacts the substrate is greater than a width of the encapsulation material at the opening.

7. The method of claim 4, wherein a width of the encapsulation material where the encapsulation material contacts the substrate is greater than a width of the encapsulation material at the opening.

* * * * *